United States Patent [19]
Bell et al.

[11] Patent Number: 4,494,021
[45] Date of Patent: Jan. 15, 1985

[54] SELF-CALIBRATED CLOCK AND TIMING SIGNAL GENERATOR FOR MOS/VLSI CIRCUITRY

[75] Inventors: Alan G. Bell; Richard F. Lyon; Gaetano Borriello, all of Palo Alto, Calif.

[73] Assignee: Xerox Corporation, Stamford, Conn.

[21] Appl. No.: 412,490

[22] Filed: Aug. 30, 1982

[51] Int. Cl.³ .................... H03K 5/06; H03K 17/284; H03L 7/08

[52] U.S. Cl. .................... 307/591; 307/481; 307/526; 307/601; 307/606; 331/25

[58] Field of Search ................ 307/443, 453, 480–481, 307/519, 523, 526, 591, 597, 601, 605–606, 269; 331/25

[56] References Cited

U.S. PATENT DOCUMENTS

| | | | |
|---|---|---|---|
| 3,953,674 | 4/1976 | Fletcher et al. | 375/87 |
| 3,996,481 | 12/1976 | Chu et al. | 307/481 X |
| 4,011,402 | 3/1977 | Koike et al. | 307/481 X |
| 4,103,251 | 7/1978 | Glick | 307/480 X |
| 4,185,273 | 1/1980 | Gowan | 340/347 DD |
| 4,344,041 | 8/1982 | Maine | 329/50 |
| 4,358,741 | 11/1982 | Nardin | 331/25 X |
| 4,388,537 | 6/1983 | Kanuma | 307/297 |

OTHER PUBLICATIONS

Mead and Conway, Introduction to VLSI Systems, Addison-Wesley Pub. Co., Menlo Park, CA, 1980, pp. 17–18, 67, 229–236.

Primary Examiner—Stanley D. Miller
Assistant Examiner—David R. Hudspeth
Attorney, Agent, or Firm—W. Douglas Carothers, Jr.

[57] ABSTRACT

A self-calibrated clock and timing signal generator provides reliable and continuous arbitrary digital waveforms of preselectable edge resolution. The generator comprises a multistage means to produce a time delayed signal of preselectable edge resolution and having a plurality of outputs or taps between a plurality of series connected delay stages comprising the multistage means. The delay per stage is substantially identical so that the selection of any one of the outputs is representative of a predetermined amount of delay provided to an input signal to the multistage means. Calibrating means is integrally included to develop a control signal which is coupled to each of the stages of the multistage means to continuously maintain the predetermined amount of delay per stage. In the embodiment described, the calibrating means takes the form of an automatic frequency control (AFC) loop wherein the frequency of a voltage controlled oscillator (VCO) is regulated to be equal to that of a reference frequency. The VCO comprises a plurality of series connected delay stages. The control voltage is applied to each stage to control the period of frequency of the VCO. The control voltage developed to adjust the VCO frequency is also employed to regulate the delay of the stages comprising the multistage means. The stages of the delay line are identical in construction to the stages of the VCO.

8 Claims, 10 Drawing Figures

SELF-CALIBRATED CLOCK AND TIMING SIGNAL GENERATOR FOR MOS/VLSI CIRCUITRY

TECHNICAL FIELD

This invention relates to MOS circuitry and particularly to MOS circuitry for providing on-chip regulatory functions for integrated circuitry.

RELATED APPLICATION

U.S. application Ser. No. 412,637, filed Aug. 30, 1982 and entitled DATA AND CLOCK RECOVERY SYSTEM FOR DATA COMMUNICATION CONTROLLER and assigned to the assignee herein.

BACKGROUND OF THE INVENTION

With the development of integrated circuitry and, in particular, MOS/VLSI technology in combination with more circuitry on a chip, there is a standing and ever increasing desire to be able to provide complete digital on-chip self-calibrated timing and clocking of signals employed in such circuitry.

Presently, signal timing or desired clock generation is provided by off-chip or separate or discrete integrated circuitry utilizing various conventional techniques for such generation schemes, such as one shot multivibrators, phase locked loop (PLL) arrangements and discrete signal and clock generation provided in bipolar technology. In these cases, some analog arrangement is made to check the timing or clocking period to determine that it is continually correct. Such checking is done periodically so that it may or may not be continuously accurate. As a result, timing or clocking may not always be accurate in circuit utilization, resulting in malfunctioning or loss of data. What is desired is clocking and timing circuitry that is on-chip with the integrated circuitry and is somehow self-calibrated to continuously maintain timing accuracy.

If one depends on analog values in on-chip clocking and timing, many problems are encountered because of changes that occur in physical and electrical properties in the successive processing of wafers. Uniformity in clock and signal timing generation from wafer to wafer is crucial where precise product specifications must be met and if clocking and signal timing generation properties must depend upon fabricated circuit parameters, uniformity in those properties from batch processing is next to impossible in MOS technology, e.g., nMOS. Presently, complex timing interface circuitry is employed to provide clocking and timing signals and means to verify the accuracy of such signals before applying them to perform their designated regulatory functioning. However, there is not a presently realizable methodology as to how to implement their functioning in MOS/VLSI technology, e.g., nMOS with verified accuracy and know precisely when the time occurrence of a signal transitional edge will occur and what the resolution will be between transitional edge occurrences in nMOS implemented clocking and timing.

It is the primary objective of this invention to provide self-calibrated clock and signal timing generation in MOS technology independent of significance of physical and electrical properties derived in successive integrated circuit processing.

SUMMARY OF THE INVENTION

According to this invention, a self-calibrated clock and timing signal generator provides reliable and continuous arbitrary digital waveforms of preselectable edge resolution. The generator comprises a multistage means to produce a time delayed signal of preselectable edge resolution and having a plurality of outputs or taps between a plurality of series connected delay stages comprising the multistage means. The delay per stage is substantially identical so that the selection of any one of the outputs is representative of a predetermined amount of delay provided to an input signal to the multistage means. Calibrating means is integrally included to develop a control signal which is coupled to each of the stages of the multistage means to continuously maintain the predetermined amount of delay per stage. In the embodiment described, the calibrating means takes the form of an automatic frequency control (AFC) loop wherein the frequency of a voltage controlled oscillator (VCO) is regulated to be equal to that of a reference frequency. The VCO comprises a plurality of series connected delay stages. The control voltage is applied to each stage to control the period or frequency of the VCO.

The control voltage developed to adjust the VCO frequency is also employed to regulate the delay of the stages comprising the multistage means. The stages of the delay line are identical in construction to the stages of the VCO.

The multistage means, in essence, is a tapped delay line having a digital signal propagation rate based upon the control voltage created for the VCO. Because the control voltage is not dependent on circuit component parameters or values and is related only to a reference frequency used for a comparison to a VCO frequency, the delay per stage in the delay line will be continuously calibrated and maintained accurately thereby providing highly accurate on-chip clocking or timing.

Arbitrary waveforms with a preselected edge resolution equal to the delay of one stage or a multiple thereof are obtainable at the tap outputs of the delay line. By applying conventional logic function or programmable logic circuitry to the tap outputs, any desired digital waveform configuration can be selected which is limited to the known resolution (delay time) per stage of the delay line. Such circuitry may be designed to include its own integrated and self-calibrated clock or timing signal generation to meet the needs, for example, of device controllers, memory interfaces and other integrated circuit subsystems on a single chip.

The resulting advantage is that MOS implemented clocking and timing can be made a substantially precise reality since it can be implemented independent of MOS processing and environmental operating (e.g. temperature changes) considerations while providing definitive on-chip clocking and timing resolution.

Also, asynchronous clocking can be easily implemented for different subsystems on a single MOS chip. With each chip subsystem having its own clocking source, the independent sources may be asynchronous relative to some or all other clocking sources for other subsystems on the same chip. In any case, the calibrated clocking and timing, whether asynchronous or synchronous, can be developed from a single AFC loop with multiple delay lines provided throughout the chip subsystems or combination AFC loop/delay lines provided throughout the chip subsystems.

While the use of delay lines in clock generation is not new (see for example, pages 233-236 of "Introduction to VLSI systems" by Carver Mead and Lynn Conway, published by Addison-Wesley Publishing Company, 1980, dealing with clock generation in VLSI system timing), the notion of delay lines being self-calibrated has not been previously realized in the art.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 3 is a conventional non-overlapping clock generator.

FIG. 5 is a conventional multistage ring counter.

DETAIL OF THE PREFERRED MODE FOR CARRYING OUT THE INVENTION

Figure 1:
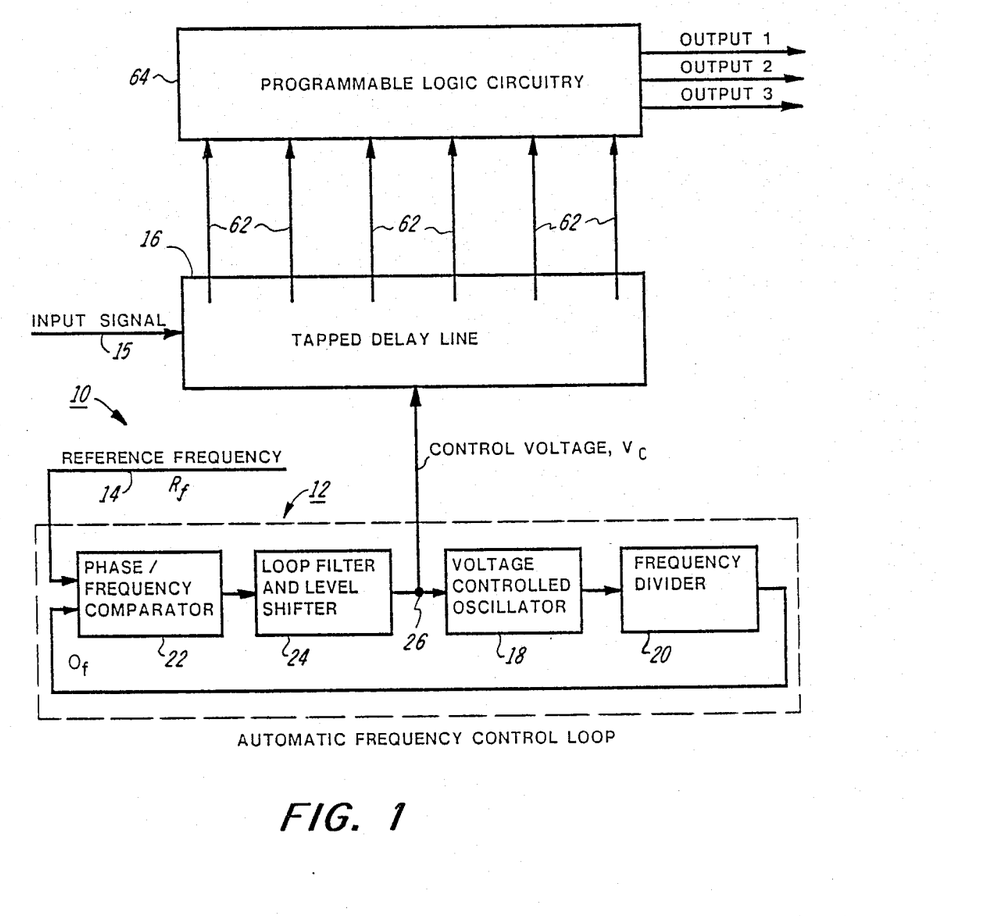
FIG. 1 is a circuit overview of the integrated clock and timing signal generator of this invention comprising a multi-selectable tapped delay line self-calibrated via an automatic frequency control loop.

As illustrated in FIG. 1, the self-calibrated integrated clock and timing signal generator 10 of this invention comprises an automatic frequency control (AFC) loop 12 having an input 14 for a reference frequency, $R_f$.

The loop 12 runs a voltage controlled oscillator (VCO) 18 at the reference frequency or some multiple of the reference frequency in a conventional manner wherein the output frequency, $O_f$, of the VCO 18 is compared with a reference frequency, $R_f$, to produce a control stage, $V_c$. $V_c$ is then applied to the VCO to adjust its frequency to be the same as $R_f$. The derived control voltage, $V_c$, is also employed to control the operation of a multistage means in the form of delay line 16 to provide a preselectable delay to an input signal supplied at input 15. The advantage obtained is that since the components comprising the delay line 16 are substantially the same as the components comprising the VCO 18, the unit delay provided by delay line 16 is known, since the unit delay of the VCO is readily determinable from the operation of the AFC loop 12. As a result, preselectable partitioning of an input signal can be easily achieved for on-chip clocking and timing.

While delay circuits and timing and clocking schemes have been employed in the past, they have been discrete or nonadjustable and dependent on analog circuit properties, necessitating lower performance, conservative designs or a higher risk of error or malfunction. Since the clock and timing signal generator of the current invention is calibrated and adjusted by an externally provided frequency, it can generate preselectable signal resolution which is both accurately known, precisely adjustable and continuously dependable, thereby allowing for optimization of various timing functions.

Referring again to FIG. 1, the output of VCO 18 is divided by some divisor or factor via frequency divider 20. The output of divider 20, termed $O_f$, is compared with the reference frequency, $R_f$ by phase/frequency comparator 22. The output of comparator 22 is connected to the loop filter and level shifter 24 which provides an output control voltage, $V_c$ on line 26. $V_c$ varies according to pulse signals provided by comparator 22 which are indicative of the amount of difference in phase between $R_f$ and $O_f$. Line 26 is coupled to both the tapped delay line 16 and the VCO 18 and controls the unit delay developed by these two multistage devices.

Figure 2:
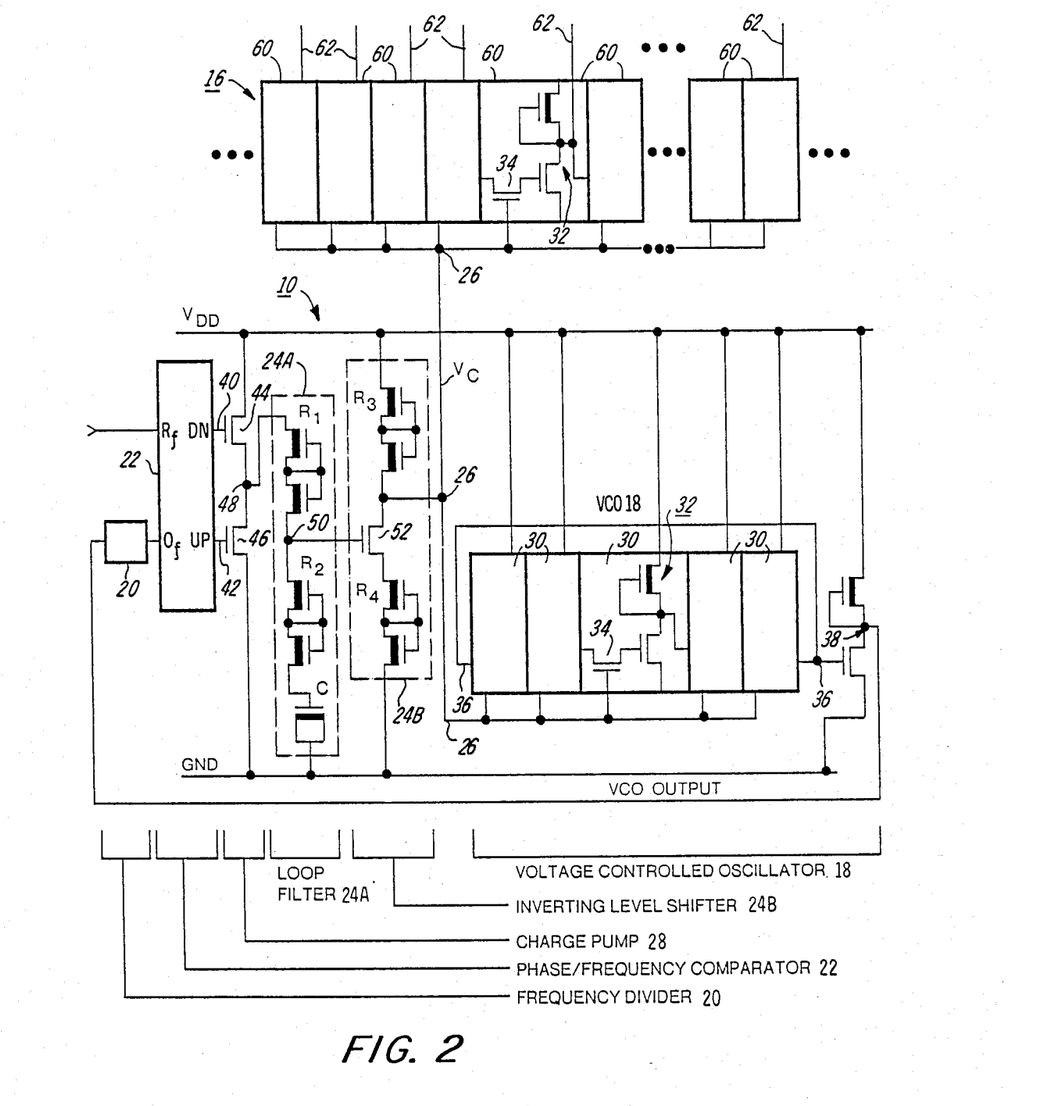
FIG. 2 is a more detailed disclosure of the circuitry for the tapped delay line and automatic frequency control loop of FIG. 1.

Reference is now made to FIG. 2 which details further features of the generator 10 of FIG. 1. Aspects of the generator circuitry not detailed in FIG. 2 are detailed in FIGS. 3-7.

The stages of VCO 18 comprises a plurality of voltage controlled delay stages 30. Delay stages 30 number five in the embodiment shown. Basically, each stage 30 comprises an inverter 32 preceded by a pass transistor 34. Each of the stages 30 are connected to $V_{DD}$ and ground (GND), as illustrated in detail in FIG. 2 for the central stage of VCO 18. The output 36 of VCO 18 is connected to inverter 38 which acts as a buffer and isolates the VCO from possible outside loads and ensures that the VCO sees a limited load capacitance. Output 36 is also connected to the pass transistor of the first stage of VCO 18 thereby providing continuous ring oscillator operation while eliminating the need for any circuit initializing. The output of inverter 38 is the input to frequency divider 20. The inversion of the VCO output 36 by inverter 38 is immaterial since it is only the frequency of this signal that is to be examined at comparator 22.

VCO 18 is operative upon application of the control voltage, $V_c$, via line 26 to each of the pass transistors 34 of its stages 30. The pass transistors 34 act as variable resistance controlled by $V_c$. Varying $V_c$ changes the resistance of transistors 34 so that the RC delay through each stage 30 will correspondingly change. $V_c$ is an analog voltage and basically causes the resistance of transistors 34 to become larger or smaller as $V_c$ respectively goes lower or higher causing the frequency of VCO 18 to respectively decrease or increase to be the same as or a multiple of $R_f$.

The period of the output, i.e., one cycle, of VCO 18 is twice the delay through all the stages 30 because for half the period, all the stages are high and for the other half of the period all the stages are low. The delay per stage ($T_o$) is derived as follows:

$$T_o = (1/R_f \times D \times 2 \times S),$$

where $R_f$ is the reference frequency, D is the divisor or division factor of frequency divider 20 and S is the number of stages in the VCO. As an example, if $R_f$ is equal to 10 MHz, D is equal to four and S is equal to five stages (as shown), the delay per stage is equal to 2.5 ns.

The function of frequency divider 20 is to divide down the frequency $O_f$ to that of frequency $R_f$ for comparison. The division factor may be any integer starting with one. For example, with a division factor of four, a reference frequency of 10 MHz and a VCO of five stages, the VCO frequency would be 40 MHz.

As previously indicated, phase/frequency comparator 22 compares $R_f$ with $O_f$ and may generate one of two possible pulse signals, termed UP and DOWN, if $R_f$ and $O_f$ are not in phase with each other. For example, if the leading edge of a pulse for $O_f$ arrives at the input of comparator 22 prior to the arrival of the leading edge of a pulse for $R_f$, comparator 22 will initiate the generation of a DOWN pulse. When the leading edge of a pulse for $R_f$ does arrive, the generation of the DOWN pulse will be terminated. Likewise, if the leading edge of a pulse for $R_f$ arrives before the leading edge of a pulse for $O_f$, an UP pulse will be generated for the period of phase difference between the arrival of these pulses.

The UP and DOWN pulses are provided as outputs 40 and 42 to change pump 28 comprising a pair of enhancement transistors 44 and 46 connected between $V_{DD}$ and GND. DOWN pulse output 40 is connected to the base of transistor 44 while UP pulse output 42 is connected to the base of transistor 46. A pulse to the base of transistor 44 acts to switch $V_{DD}$ to the input 48 of loop filter 24A. A pulse to the base of transistor 46 acts to switch the input 48 of loop filter 24A to GND.

Loop filter 24A is a second order loop filter to provide an AFC loop of small bandwidth and a low damping factor. Loop filter 24A comprises the RC network, $R_1$ and C, connected between input 48 and ground, with damping resistor $R_2$ connected between $R_1$ and C. The output 50 of loop filter 24A is connected as the input to inverting level shifter 24B. The values for $R_1$ and C for loop filter 24A are determined so that the RC time constant is fairly large and the bandwidth is low so that the loop will not react dramatically to changes occurring at its input 48.

The resistor $R_2$ is fairly small in value compared to $R_1$ and provides some damping and stability in the operation of the loop. The output 50 between $R_1$ and $R_2$ is basically a voltage divider with $R_2$ insuring small or very little ripple on the output signal to shifter 24B. Alternatively, there can be enough inherent resistance in the diffusion region of the large capacitor C to insure that the loop is stable. Ripple present in output 50 is of no real consequence because when the loop locks onto a voltage value, the UP and DOWN pulses will be so narrow that the ripple will be fairly filtered by the loop circuitry.

Examples for the values of the components of loop 24A are $R_1$ about 200 K$\Omega$, $R_2$ about 40 K$\Omega$ and C about 100 pF. p The purpose of inverting level shifter 24B is to adjust for the desired range of voltages acceptable for operating VCO 18, i.e., to shift the voltage level present on line 50 to a voltage level acceptable for operation as a control voltage to the stage inputs of VCO 18. Since the enhancement transistor 44 has some voltage drop, which is dependent on its body effect and current threshold, a voltage equal to $V_{DD}$ cannot be possibly stored on capacitor C.

However, the range of frequency operation of the VCO is such that it will operate at a maximum frequency when $V_c$ is equal to $V_{DD}$. Thus, shifter 24B acts as a voltage level translator to satisfy the operational input needs of VCO 18.

Shifter 24B comprises an input enhancement transistor 52 connected between two resistors $R_3$ and $R_4$ which are respectively connected to $V_{DD}$ and GND, as shown in FIG. 2. When pass transistor 52 is placed in a conductive state with a sufficient voltage at its base, $R_3$ and $R_4$ will function as a voltage divider so that some voltage value between GND and VDD will appear on output line 26. If the output of filter 24A is at zero or ground, transistor 52 will not be in a conducting state. Since $R_3$ is a depletion device and transistor 52 is off, $V_{DD}$ will be directly coupled as an output to line 26. From this explanation, it can be seen that the highest voltage boundary for the voltage operating range at loop output 50 from filter 24A becomes the lowest voltage boundary for the voltage operating range of $V_c$ on line 26 while the lowest voltage boundary for the voltage operating range at loop output 50 from filter 24A becomes the highest voltage boundary for the voltage operating range of $V_c$ on line 26. Intermediate voltages for $V_c$ between these $V_c$ boundaries have an approximately linear relation to the intermediate voltages between the voltage boundaries possible at loop output 50 as applied at the input of shifter 24B.

From the foregoing description, it can be seen that the AFC loop 12 provides for a control voltage, $V_c$, that is adjustable continuously so that the output frequency $O_f$ of VCO 18 is at the same phase as the reference frequency $R_f$. Thus, the delay per stage of the VCO 18 will be constantly calibrated to the same predeterminable value according to the previous definition for $T_o$.

Reference is now made to the construction of the tapped delay line 16. Delay line 16 comprises a plurality of delay stages 60 identical to stages 30 of VCO 18. Thus, pass transistor 34 and inverter 32 carry the same numerical identifier. As implemented in MOS/VLSI technology, e.g., nMOS, the components comprising stages 30 and 60 have the same orientation so that mask misalignments occurring during fabrication will have an identical effect and, consequently, their physical properties and attributes. Also, it is preferred, although not absolutely necessary, that these stage components be fabricated in close proximity on a wafer or chip to ensure no large variation across the chip. Further, it is preferred, although not absolutely necessary in all cases, that there be some similarity as to the impedance load present on these two stage component devices. Impedance matching can be easily implemented by providing additional capacitance at points along the stage component to be matched, which capacitance may, for example, be supplied in the form of a shunt depletion transistor acting as capacitive load.

From the foregoing description, it is clear that each stage 60 of the delay line 16 will have a delay substantially equal to each stage 30 of VCO 18. By providing the appropriate taps 62 at all or selected stages 60 of delay line 16, a delay version of an input signal 15 may be provided to have a predetermined waveform of preselected edge resolution because the delay per stage is a known value and the point of edge resolution (signal transition) may be determined by the preselection of designated taps 62. The taps 62 are selected for application to appropriate programmable logic circuitry 64 to perform desired conventional logic functions, e.g., OR and/or AND gate functioning, set/reset flip-flops, and provide desired clock signals, multiphase overlapping or non-overlapping clock signals or timing signals to control the asynchronous or synchronous operation of one or more integrated circuits or IC subsystems. Logic circuitry 64 may also be a programmable controller comprising one or more microcomputers that perform clock and timing functions according to microcode. to create a ring oscillator and, therefore, provide a clock generator having a preselected clock period. Also, the input signal 15 may be the reference frequency, $R_f$, itself, in the sense that what is desired is a general partitioning of a period into arbitrary sections limited only by the resolution of the delay per stage of delay line 16.

Reference is now made to FIGS. 3-7. The circuitry shown in these figures is conventional but is disclosed and briefly discussed to complete the detail of the circuitry for the AFC loop 12.

Figure 3:
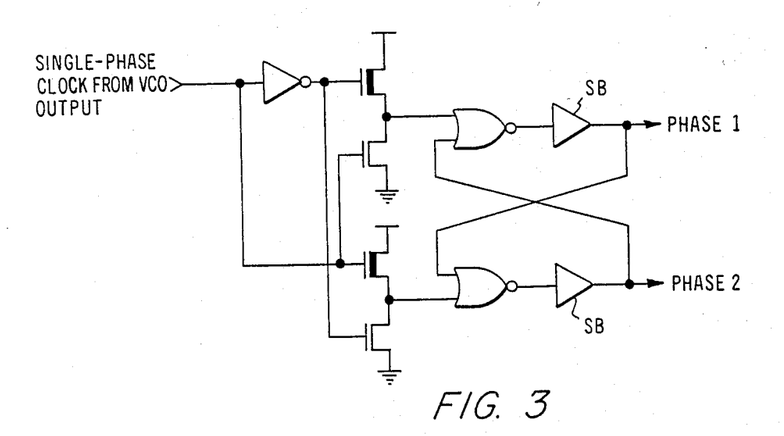
FIGS. 3 and 5 are detailed circuit implementation for the frequency divider shown in FIG. 2.
Figure 4:
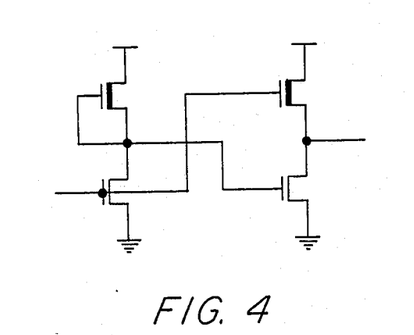
FIG. 4 is a detailed circuit implementation of the super buffers in FIG. 3.
Figure 5:
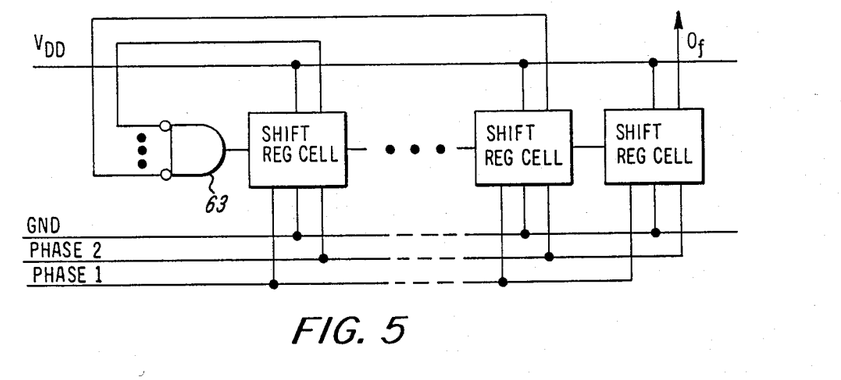

FIGS. 3 and 5 disclose logic circuitry comprising the frequency divider 20. In FIG. 3, the circuit shown is a conventional clock generator (see page 229 of "Introduction to VLSI Systems", supra) that takes the single phase clock input from VCO 18 and produces two nonoverlapping phases of that clock. FIG. 4 shows the details for the superbuffers SB in FIG. 3 comprising cross-coupled inverters to ensure overlap and are detailed at pages 17 and 18 in "Introduction to VLSI Systems", supra.

Figure 6:
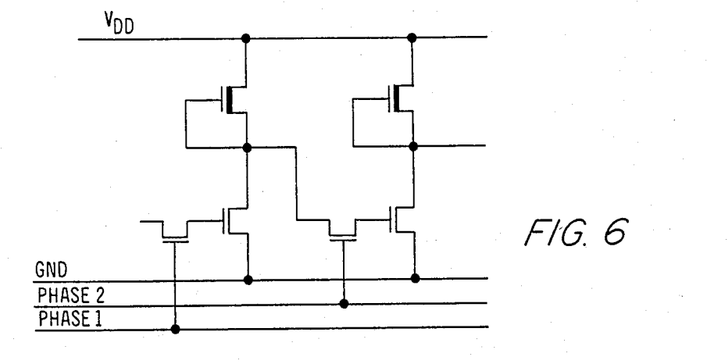
FIG. 6 is a detailed circuit implementation of the shift register cells in FIG. 5.

The clock phases are then supplied as inputs to a series of shift register cells, which with input gate 63, provide a conventional ring counter shown in FIG. 5. There are as many stages or cells as the division factor that is necessary. The outputs of all but the last of the shift register cells are NORed together by gate 63 to provide an input onto the first shift register cell of the counter thereby forming the ring counter. The output, $O_f$, of the last cell is the input to comparator 22. FIG. 6 shows the details for each of the shift register cells in FIG. 5 which are conventional and are detailed at page 67 of "Introduction to VLSI Systems", supra.

Figure 7:
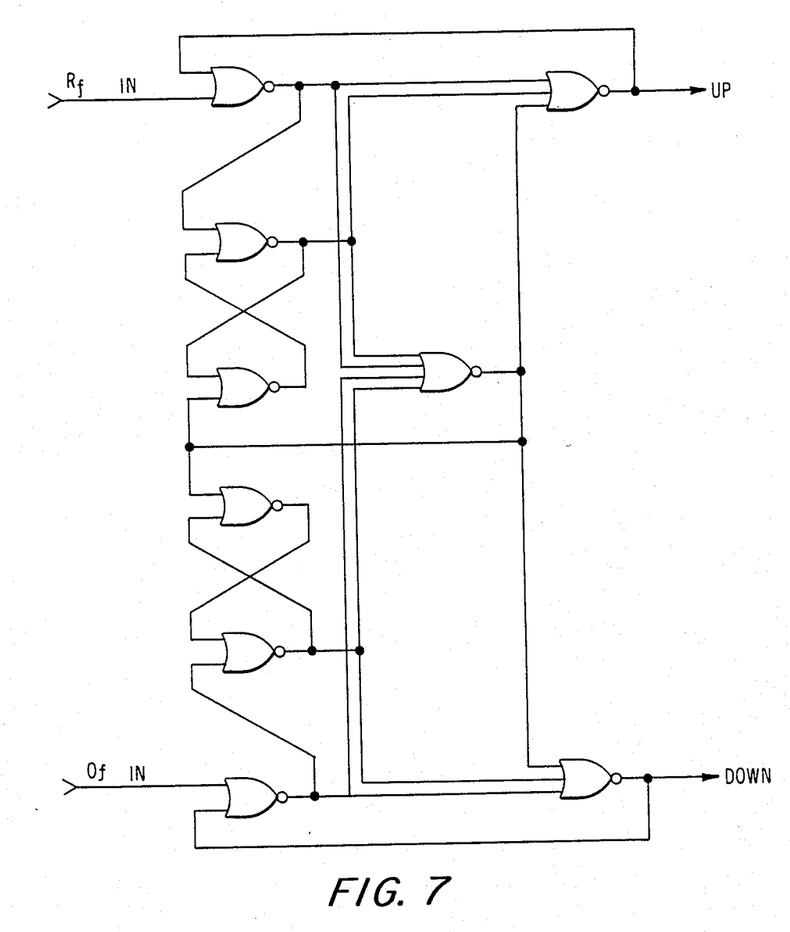
FIG. 7 is a logic diagram implementation for the phase/frequency comparator shown in FIG. 2.

FIG. 7 shows the circuit detail for the phase/frequency comparator 22 which is a conventional circuit comprising a series of NOR gates with mirror cross-coupled NOR gates and output NOR gates. Comparator 22 is similar to a MC4300/MC4000 series phase/frequency chip obtainable from Motorola Corporation. The circuit operates strictly on transitional edges of an incoming signal $R_f$ or $O_f$. The pulse width produced at outputs 40 or 42 are proportional to how far apart the transitional edges of the two input pulses from signals $O_r$ and $O_f$ may be at any given time.

The embodiment shown discloses AFC loop 12 calibrating a single delay line 16 via control voltage, $V_c$. It should be clear that multiple independent delay lines may be each controlled by control voltage, $V_c$ from a single AFC loop 12. Each of the delay lines, for example, may be provided at a respective modular on-chip subsystem to provide a clocking source for the subsystem that may be synchronous or asynchronous relative to other clocking sources supplied via other delay lines in other subsystems on the same chip.

Figure 8:
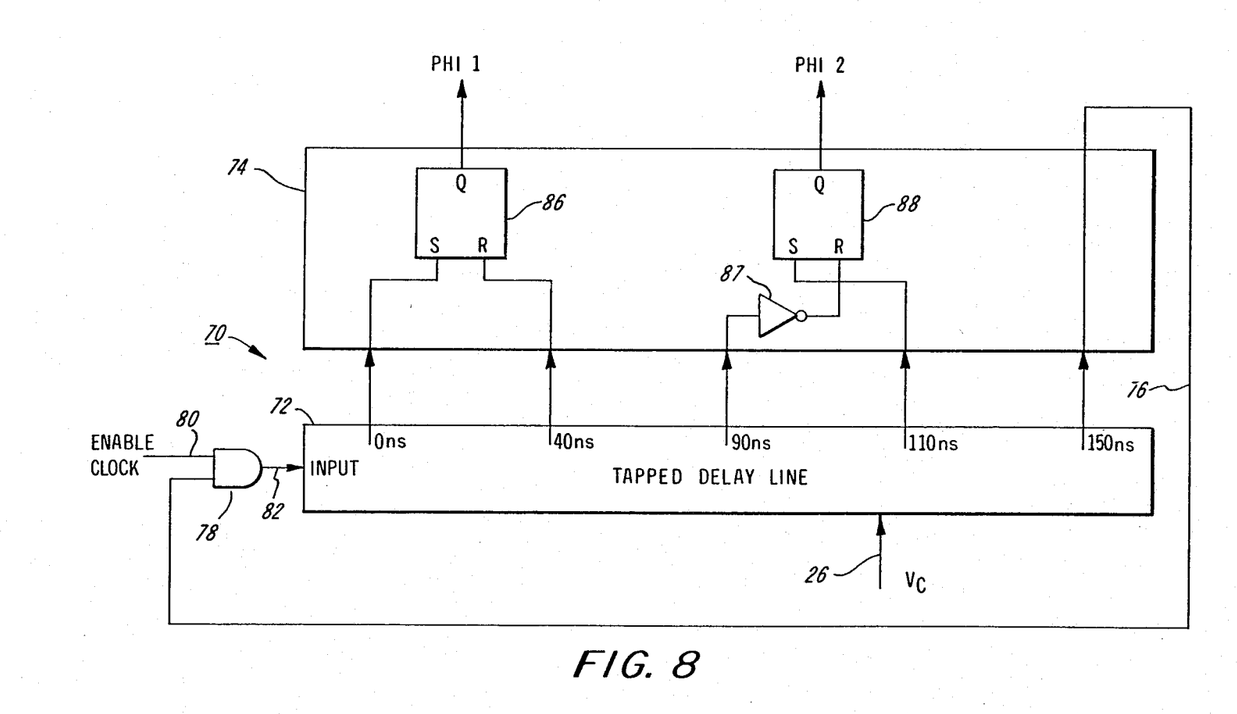
FIG. 8 is an example of a specific implementation of a generator comprising this invention relating to a two phase nonoverlapping clocking scheme.

In FIG. 8, an example is given for a self-calibrated clock and timing signal generator comprising this invention. Generator 70 provides for the generation of arbitrary two phase, nonoverlapping clocks, Phi 1 and Phi 2. By arbitrary, it is meant that the waveforms for Phi 1 and Phi 2 have cyclic periods that are quite different from one another both in phase and duty cycle. These attributes can be preselected relative to the determination as to where taps will be positioned along the tapped delay line.

In FIG. 8, the delay line 72 is 150 ns long. There are five taps from line 72 at the 0 ns, 40 ns, 90 ns, 110 ns and 150 ns stages of the line. The outputs of these taps are prvided as inputs to the programmable logic circuitry 74. The input to the delay line 72 is a feedback signal from the last stage output at 150 ns which is supplied to AND gate 78 via feedback line 76. AND gate 78 is enabled by a signal ENABLE CLOCK provided on input 80 to AND gate 78.

When AND gate 78 is enabled by ENABLE CLOCK (see FIG. 9 and ENABLE CLOCK waveform), the feedback signal on line 76 is gated onto input line 82 to delay line 72. Thus, the clock can be made to stop by disenabling gate 78 via withdrawal of ENABLE CLOCK, as exemplified at point 84 along the waveforms of FIG. 9.

The frequency of the delay line 72 mat be set by choosing an odd numbered stage (the fifteenth and last stage in this example with a delay per stage, $T_o$, of 10 ns) to feedback to input line 82 and create a ring oscillator. The period of clock will be twice the delay from the input of delay line 72 to the designated tap. During one half the clock period, a low or "0" propagates down line 72 and during the other half a high or "1" propagates down line 72. This is exemplified by the INPUT TO DELAY LINE waveform of FIG. 9 wherein for the first 150 ns of the clock period of 300 ns, the propagating signal is high and for the last 150 ns, the signal is low.

To be noted is that the time delay per stage of delay line 72 may be 10 ns or less. If 10 ns, then there are 15 stages comprising the line. If 2.5 ns, then there are 60 stages comprising the line. With a greater number of stages, increased signal generation resolution is obtained.

Figure 9:
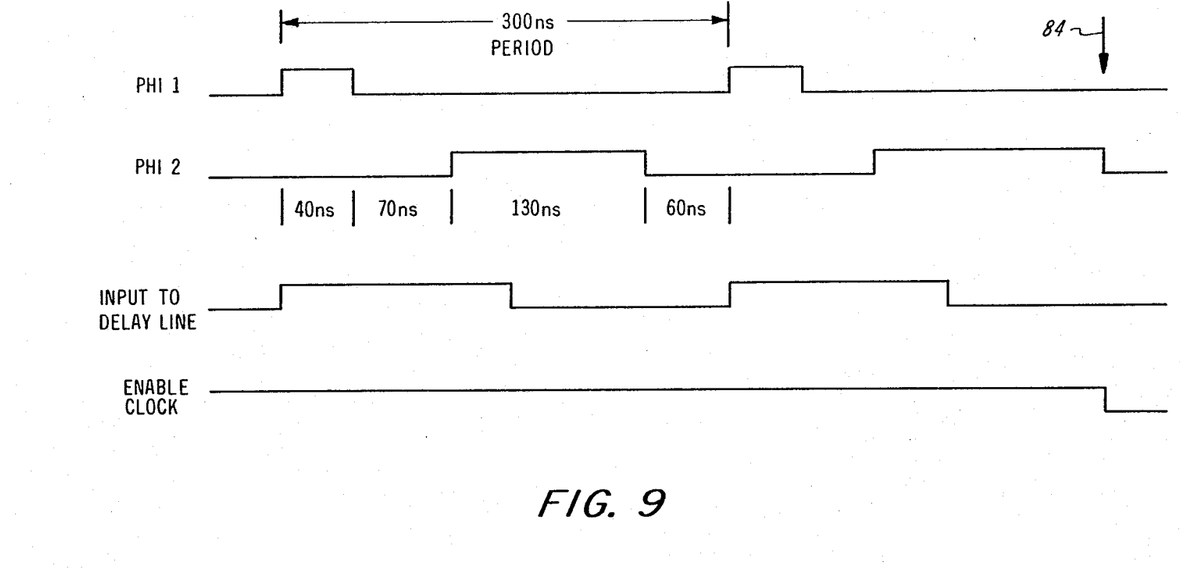
FIG. 9 is a waveform diagram illustrating the operation of the circuitry shown in FIG. 8.

For the particular example at hand, Phi 1 and Phi 2 have a 300 ns cycle or period. Phi 1 is high for the first 40 ns of the period and is low for the remainder of the period. However, Phi 2 is low for the first 110 ns of the clock period and then high for 130 ns, followed by a low for 60 ns which extends into the 110 ns low of its next period. Thus, there are two nonoverlapping signals, one having a shorter time within the clock period and the other a longer time within the clock period.

Figure 10:
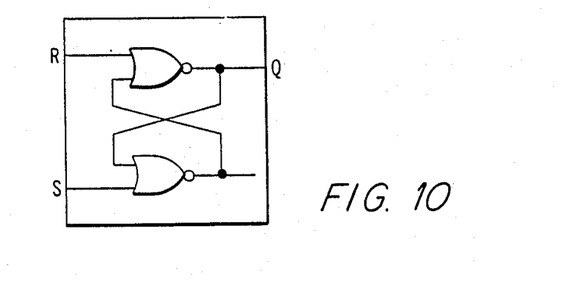
FIG. 10 is a logic diagram for the flip-flop logic disclosed in FIG. 8.

The waveforms for Phi 1 and Phi 2 in FIG. 9 are generated respectively by the SR flip-flops 86 and 88 comprising the circuitry 74. Flip-flops 86 and 88 are conventional and their logic diagram is shown in FIG. 10 comprising cross-coupled NOR gates having a single Q output. Flip-flop 88 differs from flip-flop 86 in that its R input is inverted.

The R and S inputs of flip-flop 86 are respectively connected to the 0 ns and 40 ns taps of delay line 72 while the R input, via inverter 87, and the S input of flip-flop 88 are respectively connected to the 90 ns and 110 ns taps of delay line 72. Upon examination of the waveforms in FIG. 9, it can be seen that a propagating high or "1" pulse at the input to the delay line will immediately set flip-flop 86 generating a high output at Phi 1 until the pulse reaches the 40 ns delay point in line 72 thereby resetting flip-flop 86 to its low output. By the same token, the same pulse will propagate to the 90 ns delay point but have no effect due to invertor 87 at input R of flip-flop 88. Upon reaching the 110 ns point of delay line 72, flip-flop 88 will be set generating a high output at Phi 2.

Just after this point in time, a propagating low or "0" has started through delay line 72 at 150 ns (see INPUT TO DELAY LINE waveform) and when it reaches the 90 ns delay point in line 72, being a low binary value, it will reset flip-flop 88 to its low state, being 60 ns before the end of the 300 ns clock period. The propagating low, of course, has no affect at inputs from taps 0 ns, 40 ns and 110 ns.

The foregoing example illustrates the versatility in controlling the aspects of period, phase, duty cycle and nonoverlap times of one or more clocking signals continually calibrated to these aspects as preselected in the design of particular MOS/VLSI circuitry. Another example of its versatility is its use as a data and clock recovery system in a data communication system disclosed in the previously mentioned related case. A still further example is its use as a repeater in the transmission medium of a local computer network providing for accurate signal repeating.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims.

What is claimed is:

1. A self-calibrated clock and timing signal generator to provide arbitrary digital waveforms of preselected edge resolution comprising
    multistage means to produce a time delayed signal of preselectable edge resolution from a plurality of outputs between successively coupled delay stages comprising said multistage means, the delay per stage of said multistage means being equal so that the selection of any one of said outputs is representative of a predetermined amount of delay provided to an input signal to said multistage means and
    calibrating means including a voltage control oscillator having a plurality of delay stages, each of identical structure to each of said multistage means delay stages, said calibrating means to develop a control signal and apply said control signal to said multistage means to continuously maintain said predetermined amount of delay per stage.

2. The self-calibrated clock and timing signal generator of claim 1 wherein said calibrating means is an automatic frequency control loop including said voltage controlled oscillator, the control signal developed to drive the delay stages of said oscillator is also employed to drive the delay stages of said multistage means.

3. The self-calibrated clock and timing signal generator of claim 2 wherein said automatic frequency control loop comprises
    means to compare the operating frequency of said voltage controlled oscillator with a reference frequency and develop an output representative of any difference therebetween, and
    means to produce a control voltage being said control signal and representative of said difference to adjust said operating frequency of said voltage controlled oscillator to be the same as that of said reference frequency whereby the adjustment made to the unit delay provided by all of said delay stages is uniform and independent of any differences in the physical and electrical characteristic that may be present in the circuitry comprising said self-calibrated clock and timing signal generator.

4. The self-calibrated clock and timing signal generator of claim 3 wherein said comparing means includes a frequency divider.

5. A self-calibrating clock and timing signal generator integratable into on-chip circuitry to provide arbitrary digital waveforms of preselected edge resolution comprising
    frequency generator means the frequency of which is calibrated according to a comparison with a reference frequency to develop a control signal to maintain its calibration,
    said frequency generator means including a first voltage control oscillator having a plurality of first delay stages coupled to one another by first signal pass means, the output of which is said frequency,
    said control signal coupled to each of said first signal pass means,
    tapped delay line means having means to receive an input signal and comprising a second voltage control oscillator and having a plurality of second delay stages coupled to one another by second signal pass means with a selectable tap output between at least several of said second delay stages,
    said control signal coupled to each of said second signal pass means,
    said first and second delay stages and said first and second signal pass means being of identical structure,
    circuit means coupled to selected of said output taps to produce at least one such digital waveform of preselected edge resolution.

6. The self-calibrated clock and timing signal generator of claim 5 wherein both of said oscillators are ring voltage control oscillators and said input signal is the output of the last delay stage of said delay line means.

7. The self-calibrated clock and timing signal generator of claim 5 wherein said first and second signal pass means comprises a transistor.

8. A method of providing arbitrary digital waveforms of preselected edge resolution based upon a known reference frequency comprising the steps of:
    providing a ring oscillator comprising a series of delay stages coupled to one another by signal passing means to produce an output frequency,
    comparing the output frequency with said reference frequency to produce a voltage control signal representative of the frequency difference between said reference frequency and said output frequency,
    supplying said control signal to the signal pass means of said oscillator to control the frequency of said output frequency to be the same or multiple of said reference frequency,
    providing a delay line having a plurality of output taps capable of providing a preselectable delay to an input signal supplied thereto and comprising a series of delay stages coupled to one another by signal pass means identical in structure to the delay stages and signal pass means of said oscillator,
    supplying the control signal to the signal pass means of said delay line so that the unit delay per stage is continually the same based upon said reference frequency, and
    selecting an output from at least one pair of said taps to produce a waveform of predetermined edge resolution and duty cycle based primarily upon the number of stages in said delay line and the selection of said reference frequency.

* * * * *